(12) United States Patent
Richardson et al.

(10) Patent No.: US 7,395,490 B2
(45) Date of Patent: Jul. 1, 2008

(54) LDPC DECODING METHODS AND APPARATUS

(75) Inventors: Tom Richardson, South Orange, NJ (US); Hui Jin, Annendale, NJ (US); Vladimir Novichkov, Towaco, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 306 days.

(21) Appl. No.: 10/895,645

(22) Filed: Jul. 21, 2004

(65) Prior Publication Data

US 2006/0020868 A1    Jan. 26, 2006

(51) Int. Cl.
*H03M 13/00* (2006.01)

(52) U.S. Cl. ........................... 714/779; 714/776

(58) Field of Classification Search ............ 714/779, 714/776

See application file for complete search history.

(56) References Cited

U.S. PATENT DOCUMENTS

| | | | |
|---|---|---|---|
| 3,542,756 | A | 11/1970 | Gallager |
| 3,665,396 | A | 5/1972 | Forney, Jr. |
| 4,295,218 | A | 10/1981 | Tanner |
| 5,157,671 | A | 10/1992 | Karplus |
| 5,271,042 | A | 12/1993 | Borth et al. |
| 5,293,489 | A | 3/1994 | Furui et al. |
| 5,313,609 | A | 5/1994 | Baylor et al. |
| 5,396,518 | A | 3/1995 | How |
| 5,457,704 | A | 10/1995 | Hoeher et al. |
| 5,526,501 | A | 6/1996 | Shams |
| 5,615,298 | A | 3/1997 | Chen |
| 5,671,221 | A | 9/1997 | Yang |
| 5,860,085 | A | 1/1999 | Stormon et al. |
| 5,864,703 | A | 1/1999 | Van Hook et al. |
| 5,867,538 | A | 2/1999 | Liu |
| 5,892,962 | A | 4/1999 | Cloutier |
| 5,933,650 | A | 8/1999 | van Hook et al. |
| 5,968,198 | A | 10/1999 | Hassan |
| 6,002,881 | A | 12/1999 | York et al. |

(Continued)

OTHER PUBLICATIONS

Singla et. al., Iterative Decoding and Equalization for 2-D Recording Channels, Sep. 2002, IEEE, vol. 38. No. 5, pp. 2328-2330.*

(Continued)

*Primary Examiner*—Mujtaba Chaudry
(74) *Attorney, Agent, or Firm*—Ross L. Franks; Kenneth K. Vu; Thomas Rouse

(57) ABSTRACT

A flexible and relatively hardware efficient LDPC decoder is described. The decoder can be implemented with a level of parallelism which is less than the full parallelism of the code structure used to control the decoding process. Each command of a relatively simple control code used to describe the code structure can be stored and executed multiple times to complete the decoding of a codeword. Different codeword lengths are supported using the same set of control code instructions but with the code being implemented a different number of times depending on the codeword length. The decoder can switch between decoding codewords of different lengths, without the need to change the stored code description information, by simply changing a code lifting factor that is indicative of codeword length and is used to control the decoding process. When decoding codewords shorter than the maximum supported codeword length some block storage locations may go unused.

21 Claims, 7 Drawing Sheets

U.S. PATENT DOCUMENTS

| | | | |
|---|---|---|---|
| 6,073,250 | A | 6/2000 | Luby et al. |
| 6,195,777 | B1 | 2/2001 | Luby et al. |
| 6,247,158 | B1 | 6/2001 | Smallcomb |
| 6,266,758 | B1 | 7/2001 | van Hook et al. |
| 6,298,438 | B1 | 10/2001 | Thayer et al. |
| 6,339,834 | B1 | 1/2002 | Crozier et al. |
| 6,397,240 | B1 | 5/2002 | Fernando et al. |
| 6,438,180 | B1 | 8/2002 | Kavcic et al. |
| 6,473,010 | B1 | 10/2002 | Viyaev et al. |
| 6,484,284 | B2 | 11/2002 | Smallcomb |
| 6,526,538 | B1 | 2/2003 | Hewitt |
| 6,633,856 | B2 | 10/2003 | Richardson et al. |
| 6,718,504 | B1 | 4/2004 | Coombs et al. |
| 6,724,327 | B1* | 4/2004 | Pope et al. .............. 341/67 |
| 6,731,700 | B1 | 5/2004 | Yakhnich et al. |
| 6,754,804 | B1 | 6/2004 | Hudepohl et al. |
| 6,842,873 | B1* | 1/2005 | McLaughlin et al. ........ 714/709 |
| 6,940,431 | B2* | 9/2005 | Hayami .................. 341/102 |
| 7,222,284 | B2* | 5/2007 | Stolpman ................ 714/774 |
| 7,251,769 | B2* | 7/2007 | Ashikhmin et al. ........ 714/755 |
| 2002/0042899 | A1* | 4/2002 | Tzannes et al. ............. 714/786 |
| 2004/0034828 | A1 | 2/2004 | Hocevar |
| 2004/0098659 | A1* | 5/2004 | Bjerke et al. ............. 714/776 |
| 2005/0050435 | A1* | 3/2005 | Kyung et al. ............. 714/800 |
| 2005/0154958 | A1* | 7/2005 | Xia et al. ................ 714/752 |
| 2005/0229088 | A1* | 10/2005 | Tzannes et al. ........... 714/800 |
| 2005/0246617 | A1* | 11/2005 | Kyung et al. ............. 714/801 |
| 2006/0031734 | A1* | 2/2006 | Stolpman ................. 714/752 |

OTHER PUBLICATIONS

T. Richardson and R. Urbanke, "The Capacity of Low-Density Parity-Check Codes under Message-Passing Decoding", pp. 1-44 (Mar. 2001).

Saied Hemati, Amir H. Banihashemi, VLSI circuits: Iterative decoding in analog CMOS, Proceedings of the 13th ACM Great Lakes Symposium on VLSI Apr. 2003, pp. 15-20.

Mohammad M. Mansour, Naresh R. Shanbhag, Session 11: Low-power VLSI decoder architectures for LDPC codes, Proceedings of the 2002 international symposium on Low power electronics and design Aug. 2002, pp. 284-289.

Richardson et al. "The capacity of low-density parity-check codes under message-passing Decoding", IEEE Transactions on Information Theory; pp. 599-618, Feb. 2001, (same inventor) whole document.

Paranchych et al. "Performance of a digital symbol synchronizer in cochannel interference and noise", IEEE Transactions on Communications, pp. 1945-1954; Nov. 2000, whole document.

Sorokine, V. et al. "Innovative coding scheme for spread-spectrum communications", The Ninth IEEE International Symposium on Indoor and Mobile Radio Communications, pp. 1491-1495, vol. 3; Sep. 1998, whole document.

NN77112415. "Digital Encoding of Wide Range Dynamic Analog Signals", IBM Tech. Disclosure Bulletin, Nov. 1, 1997, vol. No. 20; Issue No. 6; pp. 2415-2417, whole document.

NN9210335. "Hierarchical Coded Modulation of Data with Fast Decaying Probability Distributions", IBM Tech. Disclosure Bulletin, Oct. 1992, vol. No. 35; Issue No. 5; pp. 335-336, whole document.

T. Richardson and R. Urbanke, "An Introduction to the Analysis of Iterative Coding Systems", pp. 1-36.

T. Richardson, A. Shokrollahi, R. Urbanke, "Design of Capacity-Approaching Irregular Low-Density Parity-Check Codes", pp. 1-43 (Mar. 2001).

T. Moors and M. Veeraraghavan, "Preliminary specification and explanation of Zing: An end-to-end protocol for transporting bulk data over optical circuits", pp. 1-55 (May 2001).

R. Blahut, "Theory and Practice of Error Control Codes", Library of Congress Cataloging in Publication Data, pp. 47-49, (May 1984).

W. W. Peterson and E.J. Weldon, Jr., "Error-Correcting Codes", Second Edition, The Massachusetts Institute of Technology, pp. 212-213,261-263, 263, (1986).

Richardson et al. "The capacity of low-density parity-check codes under message-passing Decoding", IEEE Transactions on Information Theory; pp. 599-618, Feb. 2001, (same inventor) whole document.

Paranchych et al. "Performance of a digital symbol synchronizer in cochannel interference and noise", IEEE Transactions on Communications, pp. 1945-1954; Nov. 2000, whole document.

Sorokine, V. et al. "Innovative coding scheme for spread-spectrum communications", The Ninth IEEE International Symposium on Indoor and Mobile Radio Communications, pp. 1491-1495, vol. 3; Sep. 1998, whole document.

NN77112415. "Digital Encoding of Wide Range Dynamic Analog Signals", IBM Tech. Disclosure Bulletin, Nov. 1, 1997, vol. No. 20; Issue No. 6; pp. 2415-2417, whole document.

NN9210335. "Hierarchical Coded Modulation of Data with Fast Decaying Probability Distributions", IBM Tech. Disclosure Bulletin, Oct. 1992, vol. No. 35; Issue No. 5; pp. 335-336, whole document.

T. Richardson and R. Urbanke, "An Introduction to the Analysis of Iterative Coding Systems", pp. 1-36, 2001.

T. Richardson, A. Shokrollahi, R. Urbanke, "Design of Capacity-Approaching Irregular Low-Density Parity-Check Codes", pp. 1-43 (Mar. 2001).

T. Moors and M. Veeraraghavan, "Preliminary specification and explanation of Zing: An end-to-end protocol for transporting bulk data over optical circuits", pp. 1-55 (May 2001).

R. Blahut, "Theory and Practice of Error Control Codes", Library of Congress Cataloging in Publication Data, pp. 47-49, (May 1984).

W. W. Peterson and E.J. Weldon, Jr., "Error-Correcting Codes", Second Edition, The Massachusetts Institute of Technology, pp. 212-213,261-263, 263, (1986).

* cited by examiner

PRIOR ART $$H = \begin{bmatrix} 1 & 1 & 1 & 1 & 0 & 1 & 1 & 0 & 0 & 0 \\ 0 & 0 & 1 & 1 & 1 & 0 & 1 & 1 & 1 & 0 \\ 0 & 1 & 0 & 1 & 0 & 1 & 0 & 1 & 1 & 1 \\ 1 & 0 & 1 & 0 & 1 & 1 & 0 & 1 & 0 & 1 \\ 1 & 1 & 0 & 0 & 1 & 0 & 1 & 0 & 1 & 1 \end{bmatrix} \quad X = \begin{bmatrix} X_1 \\ X_2 \\ X_3 \\ X_4 \\ X_5 \\ X_6 \\ X_7 \\ X_8 \\ X_9 \\ X_{10} \end{bmatrix}$$

202 — H matrix; 206 — X vector

Figure 2

| FIGURE 7A |
|---|
| FIGURE 7B |

LDPC DECODING METHODS AND APPARATUS

FIELD OF THE INVENTION

The present invention is directed to methods and apparatus for performing Low Density Parity Check (LDPC) decoding operations and, more particularly, to decoding methods which are well suited for decoding data corresponding to codewords, e.g., codewords generated using a code structure which can be expressed as a product lifting.

BACKGROUND

Error correcting codes are ubiquitous in communications and data storage systems. Recently considerable interest has grown in a class of codes known as low-density parity-check (LDPC) codes. LDPC codes are provably good codes. On various channels, LDPC codes have been demonstrated to be really close to the channel capacity—the upper limit on transmission rate established by Claude Shannon.

LDPC codes are often represented by bipartite graphs, see exemplary graph 100 of FIG. 1, called Tanner graphs, in which one set of nodes, variable nodes 102, correspond to bits of the codeword and the other set of nodes, constraint nodes 106, sometimes called check nodes, correspond to the set of parity-check constraints which define the code. Edges 104 in the graph 100 connect variable nodes 102 to constraint nodes 106. A variable node and a constraint node are said to be neighbors if they are connected by an edge in the graph. An alternative to the Tanner graph representation of LDPC codes is the parity check matrix representation H 202, FIG. 2. A bit sequence x 206 is a codeword if and only if the product of the bit sequence and H is all-zero, that is: Hx=0.

A bit sequence associated one-to-one with the variable nodes is a codeword of the code if and only if, for each constraint node, the bits neighboring the constraint (via their association with variable nodes) sum to zero modulo two, i.e., they comprise an even number of ones.

In some cases some of these coded bits might be punctured or known. Punctured bits may be desirable in certain code structures and, in liftings (see below), both punctured and known bits can be used to achieve block lengths that are not multiples of the lifting. Punctured bits and known bits may be, and often are, excluded from the transmitted codeword.

The number of edges attached to a node, i.e., a variable node or constraint node, is referred to as the degree of the node. A regular graph or code is one for which all variable nodes have the same degree, j say, and all constraint nodes have the same degree, k say. In this case we say that the code is a (j,k) regular code. These were the codes considered originally by Gallager (1961). In contrast to a "regular" code, an irregular code has constraint nodes and/or variable nodes of differing degrees. For example, some variable nodes may be of degree 4, others of degree 3 and still others of degree 2.

While irregular codes can be more complicated to represent and/or implement, it has been shown that irregular IDPC codes can provide superior error correction/detection performance when compared to regular LDPC codes.

It will be appreciated that received words generated in conjunction with LDPC coding, can be processed by performing LDPC decoding operations thereon, e.g., error correction and detection operations, to generate a reconstructed version of the original codeword. The reconstructed codeword can then be subject to data decoding to recover the original data that was coded. The data decoding process may be, e.g., simply selecting a specific subset of the bits from the reconstructed codeword.

LDPC decoding operations generally comprise message-passing algorithms. There are many potentially useful message-passing algorithms and the use of such algorithms is not limited to LDPC decoding. The principle of a message-passing algorithm is that every node iteratively communicates to its neighbors via the connecting edge about its belief on the bit associated with the edge, the belief of the next iteration depending on the received believes on the current iteration.

Large block length LDPC codes, which correspond to large graph structures, offer many advantages over smaller codes in terms of error resiliency.

To implement a large graph structure using a smaller graph, various permutations may be applied to copies of the smaller graph structure and the copies can be linked together to generate a larger graph structure. In decoding operations, such permutation operations may be implemented by a switching device, referred to herein as a permuter, and also interchangeably referred to as a permutator, which applies a permutation operation on elements, e.g., messages in the case of a decoding operation, as they are passed between a memory and a vector processing unit which performs LDPC operations in parallel.

While various LDPC decoder implementations are known, there remains a need for methods and apparatus which can reduce LDPC decoder hardware implementation costs and/or make an LDPC decoder more flexible in terms of the number of LDPC codes which it can decode and/or the length of codewords which can be decoded by the LDPC decoder.

SUMMARY OF THE INVENTION

The present invention is directed to LDPC decoders and, more particularly, to LDPC decoders which can be implemented in a hardware efficient manner and/or which allow a degree of freedom by supporting the decoding of codewords of different lengths and/or codewords corresponding to different code structures.

In some but not all embodiments of the present invention, the LDPC decoder of the present invention is made programmable. By altering code, e.g., microcode, used to control decoder operation, decoding of codewords generated according to different code structures is possible. A device, e.g., communications device such as a wireless terminal, including the decoder of the present invention can store control code which is descriptive of different code structures. Based on information received in a communications stream or from a user, the code corresponding to LDPC coded data to be received and processed is identified and retrieved from memory. The code is then loaded into the decoder and used to control decoding as a function of the code structure determined to correspond to the data to be decoded.

In some embodiments, the decoder is loaded with a control code (e.g., microcode) corresponding to a single preselected code structure to be used by the device to control decoding. While the control code may be fixed in a particular embodiment, the same control code can be used, in accordance with the invention, to decode codewords of different sizes up to a maximum codeword size determined by the maximum amount of memory and/or registers available to support decoding of a codeword. Depending on the codeword size, the number of times a control command stored in the decoder is executed may vary.

A codeword size indictor, which may be expressed as a selected code lifting factor, can be used to specify to the decoder the size of the codeword to be decoded. The codeword size indicator will normally indicate the codeword size in terms of a multiple of a minimum block size.

While various decoders of the present invention support programmability to allow for decoding data encoded according to different LDPC code structures and codewords of different lengths, the methods and apparatus of the present invention can also be used to implement a decoder which performs LDPC decoding operations on data generated according to a single code structure and of a single codeword size. That is, the methods and apparatus of the invention are useful even in cases where programmability and supporting codewords of different sizes is not an issue.

Various embodiments of the present invention are directed to data encoded using code structures which can be expressed as LDPC graphs that possess a certain hierarchical structure in which a full LDPC graph appears to be, in large part, made up of multiple copies, Z, e.g., of a Z times smaller graph, where Z is an integer. The Z graph copies may be identical. For purposes of explaining the invention, we will refer to the smaller graph as the projected graph, the full graph as the lifted graph, and Z as the lifting factor.

Consider indexing the projected LDPC graphs by $1, \ldots, j, \ldots, Z$. In the strictly parallel graph variable nodes in graph j are connected only to constraint nodes in graph j. In accordance with the present invention, we take one vector edge, including one corresponding edge each from each graph copy, and allow a permutation within the Z edges, e.g., we permit the constraint nodes corresponding to the edges within the vector edge to be permuted, e.g., re-ordered.

We may restrict the permutations to be in the space of a subset (usually a group) of Z×Z permutation matrices, denoted as Ψ. We assume that the inverses of the permutations in Ψ are also in Ψ. The subset Ψ can in general be chosen using various criteria. One of the main motivations for the above structure is to simplify hardware implementation of decoders and encoders. Therefore, it can be beneficial to restrict Ψ to permutations that can be efficiently implemented in hardware, e.g., in a switching network.

In the U.S. Pat. No. 6,633,856 an LDPC decoder architecture taking advantage of the lifted structure is described. In that architecture, we vectorize the decoding process. Specifically, we allow the Z edges within a vector edge to undergo a permutation, or exchange, between copies of the projected graph as they go, e.g., from the variable node side to the constraint node side. In the vectorized message passing (decoding) process corresponding to the Z parallel projected graphs this exchange is implemented by permuting messages within a vector message as it is passed from one side of the vectorized graph to the other.

We briefly review an exemplary implementation of a vectorized decoder. We assume memory storing messages from variable node to check nodes and/or messages from check node to variable nodes is arranged into Z×E m-bit storage locations, where E is the number of edges and m is the number of bits carried in a message, an integer larger than 1. Memory is accessed in Z m-bit unit, in other words, each access either reads out or writes in Z m-bit. These Z m-bit correspond to the Z messages on the Z lifted edges of the lifted graph. For convenience of description, we associate each set of Z m-bit messages to the corresponding edge in the projected graph. For example, when we say we access the messages of edge e in the projected graph, we actually access the Z m-bit messages corresponding to the Z edges in the lifted graph.

Let us recall in the generic message-passing algorithm, the message updating in a node depends on all the messages from the neighbors of the node. Assume a node in the projected has d edges $e_1, e_2, \ldots, e_d$. An edge-based implementation of the message updating may read out messages of $e_j$, apply the corresponding reordering; and now the reordered messages are in proper neighboring groupings for all the Z nodes of the lifted graph. In the U.S. Pat. No. 6,633,856 the decoder architecture has Z parallel processing units for do the node processing. In one or more stages, the messages may undergo format transformation to facilitate efficient implementation. For example, different formats might be used on the variable node side and check node side.

The benefit of the vector decoder is that it achieves high throughput by providing structured parallelism. The lifting structure makes the description of the paralleled processing units in a compact way since the updated Z nodes correspond to the same node in the projected graph and all their neighboring edges correspond to the same edge in the projected graph respectively. Describing a lifted (vector) decoder normally involves the storage of the reordering and node information associated with each edge in addition to a description of small (projected) graph used to specify the larger graph structure. Assuming each edge has a constant description size, the total storage requirement on decoder information is proportional to the number of edges in the projected graph. For convenience of description, let us call this set of decoder description information the control code sometimes also referred to as the decoding microcode of a lifted graph. Therefore, for identical block length, increasing the lifting factor generally reduces the size of the decoding microcode. For large block length, this may significantly reduce the size of microcode storage memory.

In a microcode, half describes the variable node processing and the other half describes the check node processing. The decoding process executes each half of the microcode sequentially, each denoted as half of the decoding iteration. Embodiments of the U.S. Pat. No. 6,633,856 include structures doing two halves (variable node processing being one half and check node processing being the other half) of an LDPC decoding iteration, known as one full iteration, either alternatively or simultaneously. A successful decoding will normally involve a few full iterations, e.g., multiple iterations may be required until the decoding processing results in a received codeword being modified to the point where it converges to a known codeword.

One element in the vectorized parallel processing is the reordering module facilitated by a switching network. The inter connection of the Z copies are through the use of the reordering module. After message reordering, the processing simply comprises Z parallel units each correspond to a copy of the projected graph.

A vector (lifted) LDPC decoder with implementation parallelism Z, implemented in accordance with the invention, achieves Z times high data throughput compared to a decoder with parallelism 1. The tradeoff is it invokes roughly Z times more gates in hardware complexity. Although setting implementation parallelism to the same as lifting factor for a lifted graph is convenient, it is not necessary. In many cases, it may not be desirable.

For example, let us suppose a large lifting factor Z is used in describing a large graph, for the above-mentioned benefit of saving microcode storage memory. Setting the implementation parallelism equal to the lifting factor Z results in an excessive throughput.

Given the fact that hardware complexity is proportional to the implementation parallelism but graph description complexity is proportional to the lifting factor Z, it is desirable that we can set the implementation parallelism such that the resulted throughput is matching the requirement without excessiveness while using a lifted graph described using a large lifting factor Z. This benefits both the processing unit complexity and decoder description storage.

The present invention is directed to methods and apparatus of implementing a vector LDPC decoder with implementation parallelism N using a decoder description with lifting factor Z, where N is a divisor of Z. Implementation parallelism N may be chosen to match the required throughput, thus using the minimum hardware complexity.

It accomplishes this as the follows. Given the microcode for a lifted graph with lifting factor Z=K×N, the present invention specifies a decoder with implementation parallelism N that expands each iteration of decoding into K iterations. Each iteration goes through the entire microcode once, finishing 1/K of a decoding iteration by a decoder with implementation parallelism Z. Since there are N parallel processing units, the total amount of processing time comes out to be the same, which is expected. In essence, we are moving parallel processing into sequential processing without changing the microcode—describing the decoder using lifting factor N.

Moreover, in accordance with the present invention, the vector LDPC decoder with implementation parallelism N is capable of decoding a class of LDPC codes, with same rate but different codeword sizes, from the same microcode describing a decoder with lifting factor Z. Specifically, as an example, assume Z can be factored $K_1 \times K_2 \times N$, and the projected graph code size is n, where each of Z, $K_1$, $K_2$, N and n are positive integers, then the decoder may decode three different codes of block sizes N×n, $K_2 \times N \times n$ and $K_1 \times K_2 \times N \times n$.

Numerous additional features, benefits and advantages of the present invention are described in the detailed description which follows.

BRIEF DESCRIPTION OF THE FIGURES

FIG. 2 is a matrix representation of the code graphically illustrated in FIG. 1.

DETAILED DESCRIPTION OF THE INVENTION

Figure 1:
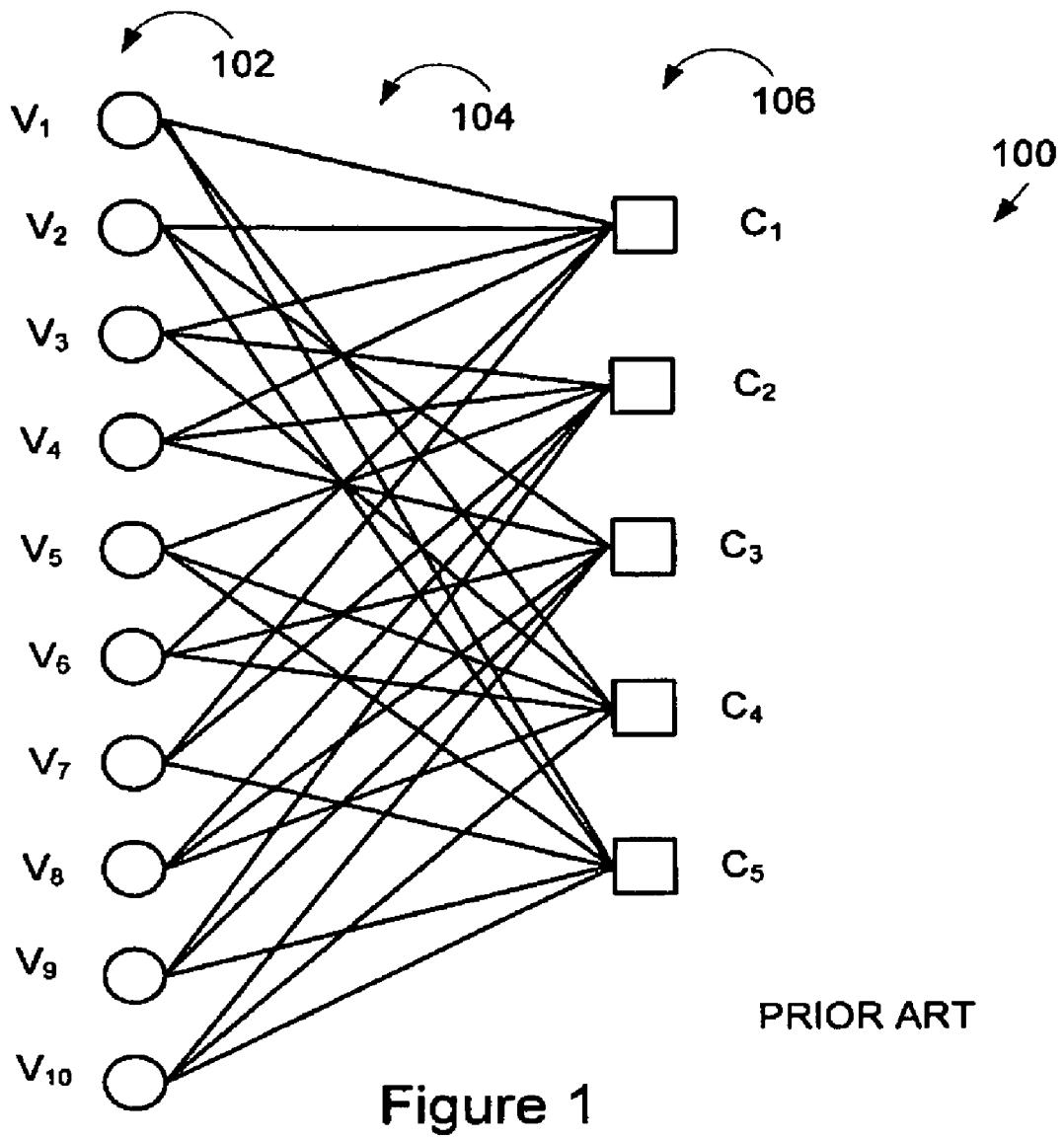
FIG. 1 illustrates a bipartite graph representation of an exemplary regular LDPC code of length ten.

The present invention is directed to LDPC decoders and, more particularly, to LDPC decoders which can be implemented in a hardware efficient manner. The decoding methods and apparatus of the present invention can be implemented as programmable devices and/or as devices which can receive codeword length indicator information and decode codewords of different lengths. Thus, while the decoders of the present invention can be implemented as fixed devices used to decode codewords of a specific codeword length allow a degree of freedom by supporting the decoding of codewords of different lengths and/or codewords corresponding to different code structures.

U.S. patent application Ser. No. 10/788,115 titled "METHOD AND APPARATUS FOR PERFORMING LOW-DENSITY PARITY-CHECK (LDPC) CODE OPERATIONS USING A MULTI-LEVEL PERMUTATION", filed on Feb. 26, 2004, which is hereby expressly incorporated by reference, described product lifting methods which can be used with LDPC codes. Product lifting further restricts the group of Z×Z permutation matrices used in lifting to be groups that can be decomposed into a direct-product of sub-groups. For example, we assume $\Psi$ is a direct-product of two groups, i.e., $\Psi = \Psi_1 \times \Psi_2$. The dimension of $\Psi$ is equal to the product of the dimensions of $\Psi_i$, where $\Psi_i$ is the group of $K_i \times K_i$ permutation matrices, where $K_i$ is an integer. It is further assumed that the dimension of group $\Psi_i$ equals to the dimension of a matrix inside the group, thus $Z = K_1 \times K_2$.

In accordance with the present invention we restrict the lifting group $\Psi$ to be a product-lifting group. A product lifting can equivalently be viewed as a multi-dimensional lifting. Assume the projected code is of size P, i.e., with P variable nodes. One could choose the cyclic group of size 64 for the lifting. An alternative, in accordance with the invention would be a product of the cyclic group of size 16 and the cyclic group of size 4. This group can be represented as follows. Consider indexing L=0, . . . 63 using pairs (a,b), a=0, . . . , 15 and b=0, . . . , 3 by the invertible map L=4a+b. An element of this product group is a pair (c,d) c=0, . . . , 15 and d=0, . . . , 3. The action of (c,d) on (a,b) is to permute the pair (a,b) to (a+c mod 16, d+b mod 4). This group also has order 64. The resulting lifted graph, however, can be interpreted as a lifting of a size 4P code by 16 or a size 16P code by 4 or a size P code by 64. The advantages offered by product liftings are realized in the context of a decoder of the invention. The value added by using product liftings is a feature of the invention. Liftings by groups which are not products, e.g., by a cyclic group, allow for liftings of arbitrary size but do not offer the flexibility of product liftings.

U.S. patent application Ser. No. 10/788,115 which has been incorporated by reference describes product lifting graphs and the potential benefits of using those graphs.

The present invention expands upon the basic principles described in the incorporated patent application. In particular, this application describes methods and apparatus for implementing a decoder using a lifting factor Z=K×N and corresponding method and apparatus for decoding the graph with an implementation parallelism N, where K, N and Z are integers and N<Z. Thus the present invention is directed to a decoder which implements a level of decoder parallelism, e.g., uses fewer check nodes and/or variable nodes, (e.g., N nodes) in parallel, than the lifting factor Z.

We assume we have a lifted LDPC graph with lifting factor Z=K×N. The lifting group $\Psi$ to be a product-lifting group $\Psi = \Psi_1 \times \Psi_2$, where K is the dimension of group $\Psi_1$, and N is the dimension of group $\Psi_2$. Thus the total lifting is the product of two smaller liftings.

An element in the vectorized parallel processing is the reordering module facilitated by a switching network. The messages are reordered according to their associated nodes, e.g., according to the processing to be performed. In a Z parallel embodiment, the implemented processing units comprise Z parallel units each correspond to a node in one copy of the projected graph.

In accordance with the invention, we use N parallel units, instead of Z parallel units. In processing, in the decoder of the invention we perform processing associated with N nodes in parallel as opposed to Z nodes. In such an implementation the decoding associated with processing a code specified by a Z times product lifting is performed by executing microcode K times, each time the N parallel units are doing message updating for N copies of the projected graph. Thus, in the jth time execution of the decoding, or a decoding pass, messages are updated for the jth N copies of the projected graph. Recall that $Z=N\times K$. Thus, at the end of the $K^{th}$ iteration a decoding pass should be complete.

We write the original message vector $d=(d_1, d_2, \ldots d_K)$, each $d_j$ is an N m-bit vector. Given the lifting group is a product lifting $\Psi=\Psi_1\times\Psi_2$, let us write the reordering information carried in each decoder description $r=(r_1,r_2)$, where $r_1$ is the reordering amount in group $\Psi_1$, and $r_2$ is the reordering amount in group $\Psi_2$. We use the notation $\Psi_i(d, r)$ to represent a reordering by amount r on vector d (of $K_i$ element) in group $\Psi_i$. The reordering can be also thought of a location permutation, so that the element $d_j$ at original location j goes to a new location denoted as $\Psi_{1,r}(j)$ in the reordered data. Then the reordering can be treated as a 2-level reordering procedure. The first level reorders in group $\Psi_2$ for N (m-bit) elements to generate vector $d'=(\Psi_2(d_1,r_2), \Psi_2(d_2,r_2)\ldots, \Psi_2(d_K,r_2))$. Then the second level reorders in group $\Psi_1$ for K (N m-bit) elements to generate vector $d''=\Psi_1(d',r_1)$. Then the reordered data d" is fed into node processing units. For convenience, let $\Psi_{1,r}^{-1}(j)$ denote the inverse of function $\Psi_{1,r}(j)$.

Hence for the jth N copies, their location inside the original Z m-bit vector is $$\Psi_{1,r_1}^{-1}(j).$$

So for an edge in the jth decoding pass, we read out data d $$\Psi_{1,r_1}^{-1}(j),$$

where the address is function of both α and j, and reorder the read-out data by the amount of $r_2$ in group $\Psi_2$, generate $\Psi_2(d_1,r_2)$. This set of messages corresponds to the set of properly ordered edge messages related to the N nodes in processing.

Figure 3:
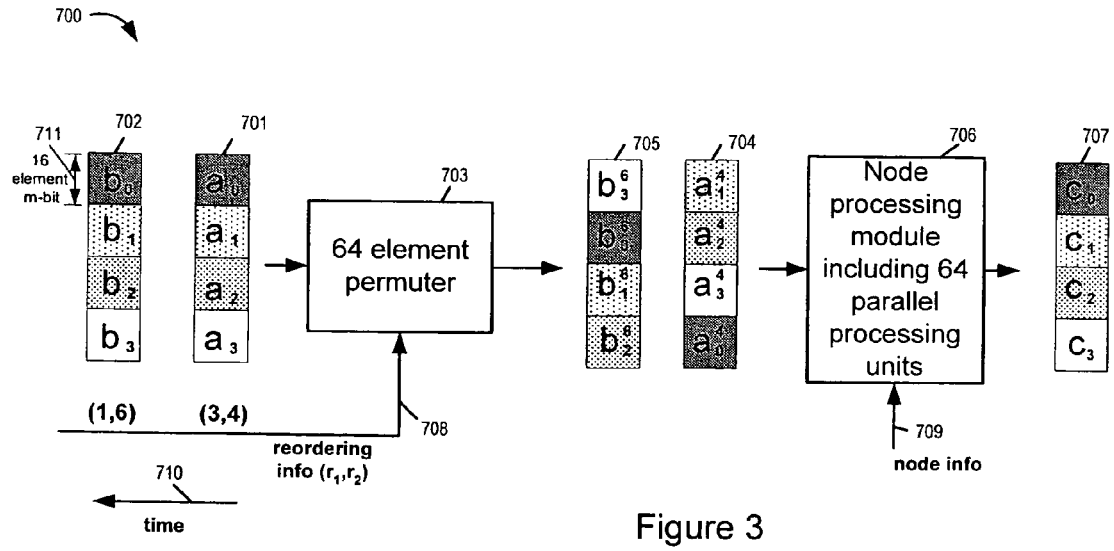
FIGS. 3 and 4 illustrates the idea of decomposing the execution of a simple set of microcode into K steps.

To facilitate understanding, we consider an example. Drawing 700 of FIG. 3 shows the decoding process for an exemplary lifted graph with a maximum lifting factor $Z=64$ using a level of parallelism matching this lifting factor. The lifting group is the direct-product of cyclic group 4 and cyclic group 16. For purposes of explaining the invention we will now describe the decoding procedure for a set of 64 variable nodes corresponding to a node v in the projected graph using a level of parallelism which is equal to $Z=64$; where node v has degree 2. Decoding procedure for degree other than 2 or check nodes will have the same characteristic. The messages from the two edges connected to v are read out in two clocks, $a=(a_0,a_1,a_2,a_3)$ 701, $b=(b_0,b_1,b_2,b_3)$ 702, each $a_j(b_j)$ is a 16 element m-bit element vector 711. Time advancement is indicated by arrow 710. Those two 64 element data 701, 702 go through a 64 element permuter 703 controlled by reordering information 708 indicated as $(r1,r2)$, where r1 represents the permutation information for the first cyclic group and r2 represents the permutation information for the second cyclic group. In our example, reordering information for data a 701 is (3,4) and reordering information for data b 702 is (1,6). Thus after reordering, $a'=(a_1^4,a_2^4,a_3^4,a_0^4)$ 704, and $b'=(b_3^6,b_0^6,b_1^6,b_2^6)$ 705, where $d^i$ represents the outcome of permuting data d by amount i in cyclic group 16. The reordered data 704, 705 then go through a node processing module including 64 parallel configurable node-processing units 706, where the parallel processing performed by each of the units is mutually independent. Therefore in the outcome data $c=(c_0,c_1,c_2,c_3)$ 707, $c_0$ only depends on $a_1$ and $b_3$, $c_1$ on $a_2$ and $b_0$, $c_2$ on $a_3$ and $b_1$, $c_3$ on $a_0$ and $b_2$. Decoder microcode command carries reordering information $r=(r1,r2)$ 708 and node information 709.

Figure 4:
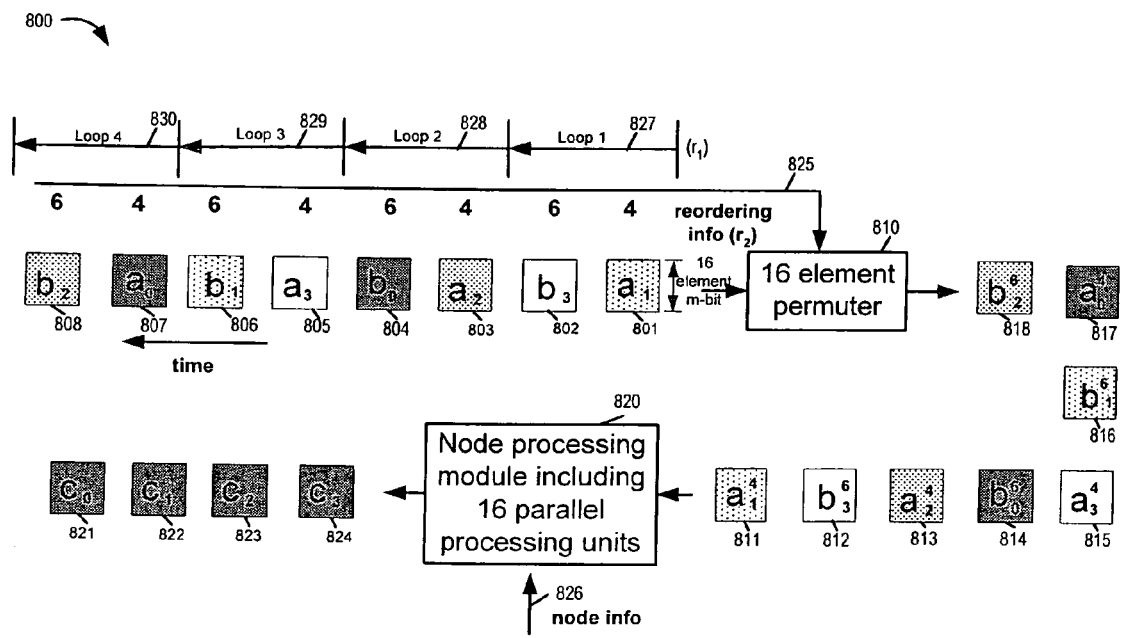

FIG. 4 which includes drawing 800 shows how we can implement the same decoding procedure shown in FIG. 3 using implementation parallelism 16 (N=16) rather than parallelism 64 (both in the permuter and in the parallel processing unit) following a microcode which supports the total lifting factor $Z=64$. The decoding is done in executing the microcode in 4 (K=4) loops where $Z=N\times K$. Data is accessed as a function of a loop counter and and recording control information r1 specified by the microcode used to control decoding in accordance with the invention.

At the start of decoding the memory 912 is loaded with data to be decoded generated from a received signal, e.g. via data input 901. This data to be decoded may be referred to as a received codeword. As a result of channel interference and/or other factors which may introduce errors into a received signal, the received codeword to be decoded may include errors which are to be detected and/or corrected by the decoding process. Decoding may be determined to be complete in a variety of ways, e.g., by all the constraints imposed on a codeword being satisfied indicating that the received codeword has been decoded to a codeword supported by the code. This may be described as the received codeword converging to a known codeword. The decoded codeword can be read from memory 912 and/or output directly form node processing module 906.

In a first loop 827, e.g., a first processing iteration, the decoder accesses data $a_1$ 801 and $b_3$ 802; in the second loop 828, the decoder accesses data $a_2$ 803 and $b_0$ 804; in the third loop 829, the decoder access data $a_3$ 805 and $b_1$ 806; and in the fourth loop 830, the decoder accesses $a_0$ 807 and $b_2$ 808, where $a_i$ and $b_i$ represent sets of 16 m-bit elements, e.g., messages being passes as part of the decoding process. Each message normally includes multiple bits, e.g., soft values including reliability information that may be communicated in some of the messages. The exemplary 4 sets of data may not be contiguous as there are other variable nodes and a loop used to finish the complete set of microcode used for performing the decoding processing, e.g., the processing of the full set of variable nodes corresponding to the code structure to be used to control decoding. These 16 elements of each accessed data unit (801, 802, 803, 804, 805, 806, 807, 808) go through a 16-element permuter 810 that is controlled by reordering information r2 825. Then the reordered data ($a^4_1$ 811, $b^6_3$ 812, $a^4_2$ 813, $b^6_0$ 814, $a^4_3$ 815, $b^6_1$ 816, $a^4_0$ 817 $b^6_2$ 818) go through a node processing module including 16 parallel node-processing units 820 that are controlled by node information 826 carried in the decoding command. The sequence $c_0$ 821, $c_1$ 822, $c_2$ 823, $c_3$ 824 is generated from the command. Therefore the same message passing result as in FIG. 3 is accomplished by the structure in FIG. 4, by using 4 times the processing time while having approximately ¼ of the hardware complexity. That is, the FIG. 4 decoder can be implemented using a level of parallelism of 16 instead of 64.

The above discussion describes how we can use parallelism N to decode using a microcode with lifting factor Z where $Z=N\times K$.

Figure 5:
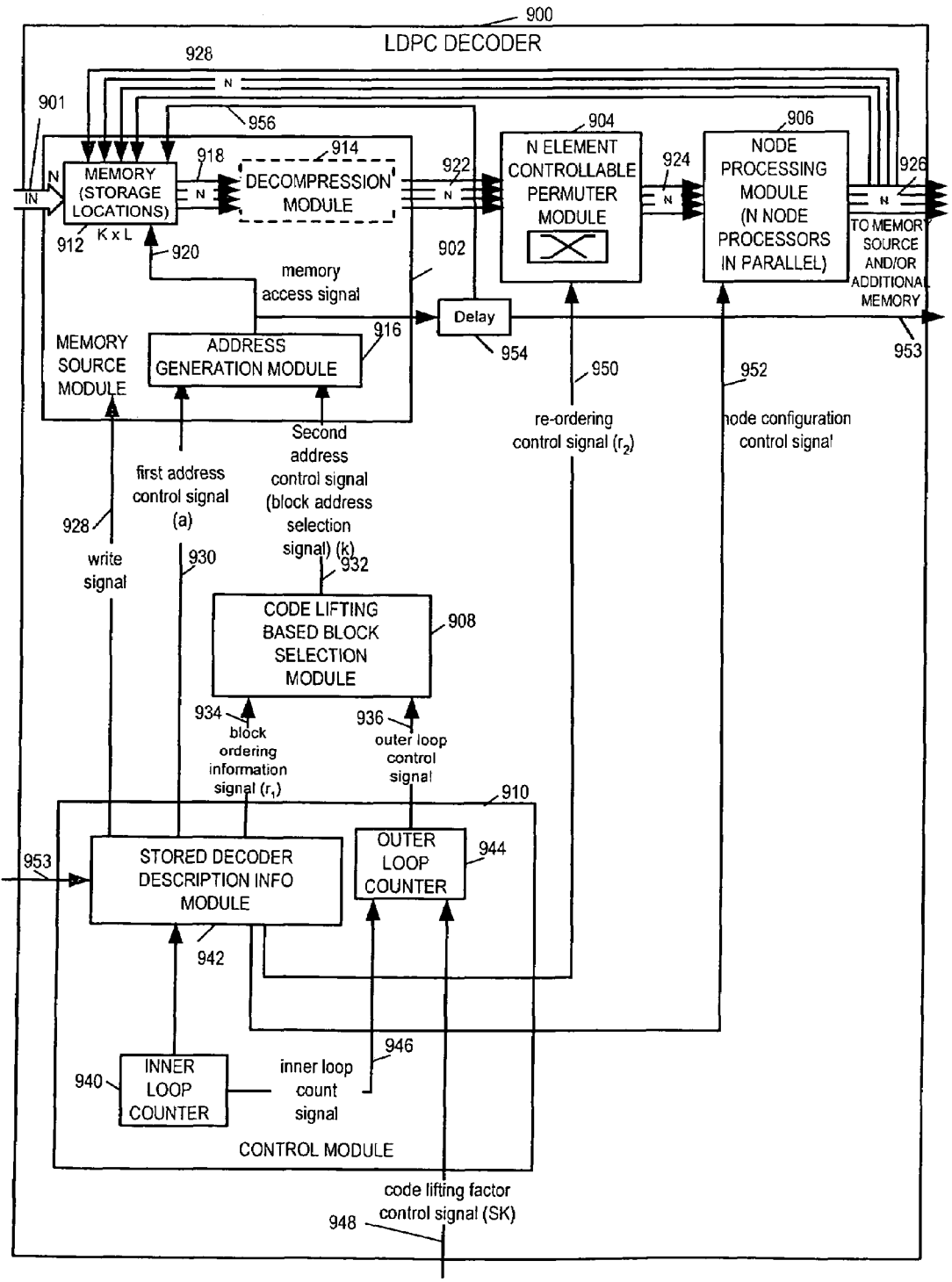
FIG. 5 illustrates an exemplary decoder architecture in accordance with the present invention.

We will now describe one exemplary LDPC decoder 900 implementation shown in FIG. 5 that implements the K-loop decoding process of the present invention using a level of parallelism N to achieve the effect of using a level of parallelism Z.

FIG. 5 shows an exemplary programmable decoder 900 implemented in accordance with the invention. The decoder 900 can be loaded via input 953 with different sets of code description information. In other embodiments, where a decoder of the present invention is not programmable, the decoder 900 is pre-loaded, e.g., with a single set of code description information and the input 953 is omitted.

Exemplary LDPC decoder 900 includes a memory source module 902, an N element controllable permuter module 904, a node processing module (N node processors in parallel) 906, a control module 910, and a code lifting based block selection module 908. Memory source module 902 includes (N×K×L) memory (storage locations) 912 where each storage location can store multiple bits, an address generation module 916, and, in some embodiments, an optional decompression module 914. The decompression module 914 is used in embodiments where messages passed as part of the decoding process between nodes are stored in a compressed format. In such a case, they may be generated and stored in a compressed format and then subject to decompression before being subjected to further processing. Compression is not required and is not used in some embodiments but message compression can save on memory requirements and is therefore implemented in some embodiments.

The control module 910 includes a stored decoder description information module 942, an inner loop counter 940, and an outer loop counter 944. The stored decoder description information module 942 includes information, e.g., a control code such as microcode, which reflects the structure of the code which was used to control the generation of the code words to be decoded and thus which is also to be used to control decoding of received encoded LDPC codewords. The control code normally includes a sequence of commands which are implemented the number of times indicated by the selected code lifting factor SK up to the maximum supported lifting factor K, where K and SK are integers.

In exemplary LDPC decoder 900 of FIG. 5, the control module 910 determines which command within the control code, e.g., microcode to be executed based on the value of the inner loop counter 940. The inner loop counter 940 increments by 1 at each step and resets upon reaching a maximum count as the number of commands inside the microcode corresponding to the stored code description being used to control decoding.

In one exemplary decoder embodiment, each line of the stored microcode which is executed in response to the control signal received from the inner loop counter 940 has the format:

op r α nci where op indicated a write operation;

where r is a number which provides permutation, e.g., message rotation, information—r is used as a compressed representation of separate rotation values r1, r2 which may alternatively be included in the command without being combined into a single value r and is normally processed by the decoder description module 942 to produce permutation information signals r1 and r2;

where memory location indicator α is a memory location indicator, e.g., value, used to provide information on which memory location in memory 912 should be accessed when the specified operation is performed; and where nci node configuration information which indicates whether the node processing module 906 should configure the nodes included therein as variable nodes or check nodes and/or how many edges are to be processed by the nodes and/or the respective bits associated with variable nodes are punctured or known.

The number of edges to be processed by a node will, in the case of an irregular code, vary depending on which node in the code structure, e.g., graph, is being implemented at a particular point in time. Through the use of node control information, the node processing module can be able to be reconfigured to perform both variable node and check node processing operations avoiding the need for separate check node and variable node processing modules.

However, implementations which have separate variable node and check node processing modules are possible and within the scope of the invention. In such embodiments, node control configuration information 952 would be supplied to both the variable node and check node processing modules with each module using the control information which was relevant to the particular module.

Operation of the decoder 900 will now be discussed further. The stored decoder description information module 942 stores code description information used to control decoding. Driven by the inner loop counter 940, the stored decoder description information module 942 executes, e.g., by outputting the appropriate control signals to implement the command, a decoding command. During each clock cycle in which the N element permuter module processes a set of data, a set of N elements are read out of memory 912. Data is written into memory when the write signal 928 is enabled, e.g., in response to the op signal generated from the stored control code indicating a write is to be performed. A read and a write can occur in the same permuter clock cycle. This will happen when the write signal 928 is enabled given that a read normally occur during each permuter clock cycle regards of the value of the write signal 928. This can be accomplished by using a dual ported memory or operating the memory module 902 at twice the rate of the permuter 904 allowing both a read and a write to memory 912 to occur in a permuter 904 clock cycle. Normally each of the elements of the decoder 900 are driven by a common clock signal. However, in some embodiments the memory 912 may be clocked at a higher rate to allow both a read and write in the period of the permuter 904 and/or node processing module 906. As discussed above, the command includes, e.g., an operator op, a memory location indicator α, reordering information r and node configuration information nci.

Operator op specifies the value of a write signal 928, e.g., a "1" may be used to indicate write enable while a "0" may indicate write disable. The write signal 928 is output from the stored decoder description information module 942 and input to the memory source module 902. The memory location information a is used to generate the first address control signal (a) 930 which is supplied from module 942 to a memory source module 902. In this manner, the address generation module 916 of the memory source module 902 receives the information a corresponding to a command to be implemented. Reordering number r is separated into two parts $(r_1, r_2)$. In various embodiments $(r_1, r_2)$ each specify the reordering of element in the group $\Psi_1$ and $\Psi_2$, respectively, which are the groups into which nodes have been arranged to implement a graph lifting as a function of two smaller liftings. The control values r1 and r2 are stored in the value r. In one exemplary embodiment r1, which is specified by r for a given implementation, is determined from the value r as the integer divisor of r when divided by N which indicated the implemented level of node parallelism. That is, r1=r div N. r2 in such an embodiment is determined from the value r by taking the modulus of r/N. Assume for example that N=16. Consider for example if r=43 and N=16, then r1=(r div N)=(43 div 16)=2, while r2=(r mod N)=(43 mod 16)=11. Reordering part $r_1$, which is generated from r by module 942, specifies block ordering information signal ($r_1$) 934 output from the stored decoder description module 942. The signal $r_1$ is provided as input to the code lifting block selection module 908, while reordering part $r_2$ determines the value of re-ordering control signal ($r_2$) 950 output from module 942. The signal $r_2$ is supplied as input to the N element controllable permuter module 904.

Node configuration information included in a command which is executed determines the node configuration control signal 952 output from module 942. The node configuration information signal 952 is provided as input to the node processing module 906 which includes N configurable node processors arranged in parallel. In many, but not necessarily all embodiments, the node configuration information results in each of the N nodes processors in module 906 being configured the same way at the same point in time. The node processors may be switched between being configured as variable nodes and check nodes.

Stored decoder description information module 942, in some embodiments, e.g., embodiments in which the decoder 900 is programmable, includes an input 953 for receiving code description information, e.g., decoder control instructions reflecting the code structure used in generating the codewords to be decoded.

Inner loop count signal 946 generated by the inner loop counter 940 is supplied as an increment control signal to outer loop counter 944. When the inner loop counter 940 reaches the maximum inner loop count value, e.g., the number of edges in the project graph, it triggers the outer loop counter 944 to be incremented by 1 and restarts counting from 0, e.g., the counter wraps around. The outer loop counter 944 determines which loop, from 1 to SK, is being executed in a complete iteration, where SK is a selected lifting factor which can range from 1 to K, where K and SK are integers. Once the outer loop counter 944 reaches the maximum, set through a code lifting factor control signal (SK) 948, the decoder 900 has finished a complete iteration and the outer loop counter 944 resets to zero. In some embodiments where the lifting factor is fixed, the SK signal input is omitted and the maximum outer loop counter value is set to K.

The code lifting based block selection module 908 receives the block ordering information signal ($r_1$) 934 from stored decoder information module 942 of control module 910 which is determined from an $r_1$ component of the reordering number r in the command from the said control module 910. Driven by the outer loop counter 944 of the control module 910 through outer loop control signal 936, and controlled by the block ordering information signal ($r_1$) 934, the code lifting based block selection module 908 generates and outputs second address control signal (block address selection signal) 932.

The memory module 902 receives write signal 928 and first address control signal (a) 930 conveying the operator and the memory location a from the control module 910. First address control signal (a) 930 and second address control signal 932 are received by the address generation module 916 of the memory source module 902. The address generation module 916 generates a memory access signal 920 specified by the information in received first and second address control signals 930, 932, and forwards the memory access signal 920 to memory 912. The signal 920 serves as a read address signal. Information is read out of the memory 912 once for each processing cycle of the N element controllable permuter 904.

The memory address signal 920 is delayed to generate write address control signal 956. The number of cycles delayed between 956 and 920 may be controlled by part of the node configuration control signal 952. The write output control signal 953 may be the same as the signal 956 and indicate the address to which a decoding result is written. The write address control signal controls the location at which the output of the node processing module 906 will be written into memory when the write signal 928 is enabled.

As shown the memory module 902 receives the output of the node processing module 906 via data input 928 or initial input through input 901. The initial input may be, e.g., a received codeword or portion of a codeword to be decoded.

The memory module 902 includes memory 912 which is arranged into K×(N×L) m-bit storage locations, were m represents the number of bits in a stored message, e.g., a soft value communicated between nodes. For convenience, we identify the storage locations with K blocks of (N×L) m-bit locations as block 1, . . . , K. The memory 912 is accessed at a location that is a function of the first address control signal a 930 and the second address control signal k 932. Memory address generation module 916 indicates such a function. Given ($\alpha$, k), the memory source module 902 reads the N element vector corresponding to location $\alpha$ in the kth block. Given the delayed ($\alpha$, k), and depending on the write signal, the memory source module 902 writes the N element vector input to location $\alpha$ in the kth block. Read and write operation for memory 912 may happen simultaneously, by using a dual-port memory or running the memory in double speed. The memory 912 may include additional memory for temporary storage of values in some embodiments.

Messages are read out of and written to memory 912 in N element units where each element includes m bits. As a set of N units 922 is read-out of memory and is supplied to the input of the N element controllable permuter module 904. In some embodiments where message compression is used, decompression module 914 receives the N elements 918 read from memory 912, performs decompression, and outputs N elements to the controllable permuter where, as the result of decompression, each of the N element in signal 922 includes more bits than was originally read from memory. In embodiments where decompression module 914 is not used, the N element unit 918 read from memory 912 is supplied to the input of the permuter module 904. Embodiments which support decompression capability and allow the node processing module to generate messages in a compressed format allow for messages to be stored using m bits which is fewer than the number of bits included in each message after decompression. N element controllable permuter module 904 implements a reordering of the N messages supplied thereto. This represents a reordering in the group $\Psi_2$.

Reordering control signal $r_2$ 950, which controls permuter 904 to perform the reordering of the N elements read from memory before they are supplied node processing module 906, is supplied by control module 910 and generated from the stored command of module 942 which is being executed.

The reordered N element vector output from the permuter module 904 is coupled to the N element vector input 924 of the N element node processing module 906. The node processing module 906 is controlled by the node configuration control signal 952 carried by the command from the said control module 910. In the illustrated embodiment, the output 926 of the node processing module 906 feeds into the memory module 902 and/or some additional memory, e.g., used for storing the result once successful decoding has been completed.

It should be noted that one variation on the described decoder embodiment is to use a decoder structure similar to the encoder implementation, described in U.S. patent application Ser. No. 10/895,547, titled "LDPC ENCODING METHODS AND APPARATUS" which is filed on the same date as the present application, which is hereby expressly incorporated by reference. Such a decoder implemented in accordance with the invention would use inner loop repetition and would include K N-element registers to hold temporary node processing results. This variation will be apparent to those skilled in the field is to be considered within the scope of this patent and the invention. Such an implementation would include many of the memory module 902, permuter module 904 and stored decoder description information module 942 features discussed herein.

In summary, given the microcode for a lifted graph with lifting factor Z=K×N, and a codeword length=K×N×L, the present invention specifies a decoder with N processing units that executes the same decoder control code K times, e.g., once during each of K passes used to complete one full decoding iteration associated with a lifted graph corresponding to Z copies of a smaller graph which can be used in specifying the code structure used to control coding of the codeword to be decoded.

In various embodiments of the present invention, the decoders of the invention can decode codewords corresponding to a class of codes that share the same rate as the projected graph, but have different codeword lengths. This is accomplished by using a selected lifting factor SK, where SK is a divisor of K, as the number of loops the decoder control code is executed to control one full iteration corresponding to the lifted graph.

More specifically, the group $\Psi_1$ in such a product lifting may still be a direct-product of two groups $\Psi_1 = \Psi_{11} \times \Psi_{12}$ and SK is the dimension of matrix $\Psi_{12}$, and J is the dimension of $\Psi_{11}$, thus K=J×SK. As a special case, $\Psi_{12}$ might be a group of single element 1 and $\Psi_{11}$ is $\Psi_1$, so SK=1 and J=K. In any event, in the lifted graph, if we ignore the $\Psi_{11}$ component inside the lifting group, then we have a lifted graph with a lifting factor Z/J=SK×N. A different way to see this is we take the original graph and project it onto the lifting group $\Psi_{11}$, thus in the parity check matrix, every nonzero entry that indicates a Z×Z permutation matrix is now projected to a Z/J×Z/J permutation matrix. As such, the same sequence of decoding process in the larger graph still holds for the projected graph.

Thus, the microcode describing the larger graph with lifting factor Z can also be used in accordance with the invention as a microcode describing the projected graph with lifting factor Z/J=SK×N. By the same line of argument as the case for Z, we can use the same decoder with N m-bit vector operation to decode a code with lifting factor SK×N by executing the microcode in SK loops to finish one iteration of decoder processing corresponding to the lifted graph.

Other codes of different codeword, e.g., block, lengths sharing the same microcode exist if $\Psi_1$ is can still be written as a direct-product of two other groups $\Psi_1 = \Psi_{11}' \times \Psi_{12}'$. The same decoder, in accordance with the present invention, with parallelism N can decode such a code with a lifting factor Z/J', where J' is the dimension of $\Psi_{11}'$ by specifying corresponding SK. Further additional structure in $\Psi_1$ may lead to more codes of different block lengths decodable on the same hardware. Therefore, by controlling SK according to the group structure to be used in a particular decoding implementation, the decoder can decode codewords having different codeword lengths.

In the exemplary LDPC decoder 900 of FIG. 5, the code lifting factor can be specified through the code lifting factor control signal (SK) 948. The signal 948 is coupled to the outer loop counter 944, determining the maximum count of the outer loop counter 944.

The methods and apparatus of the present invention can be used to implemented a wide variety of devices including, for example, wireless terminals, base stations, data storage devices and other types of devices where encoding and/or decoding of data to prevent and/or correct errors might be useful.

Figure 6:
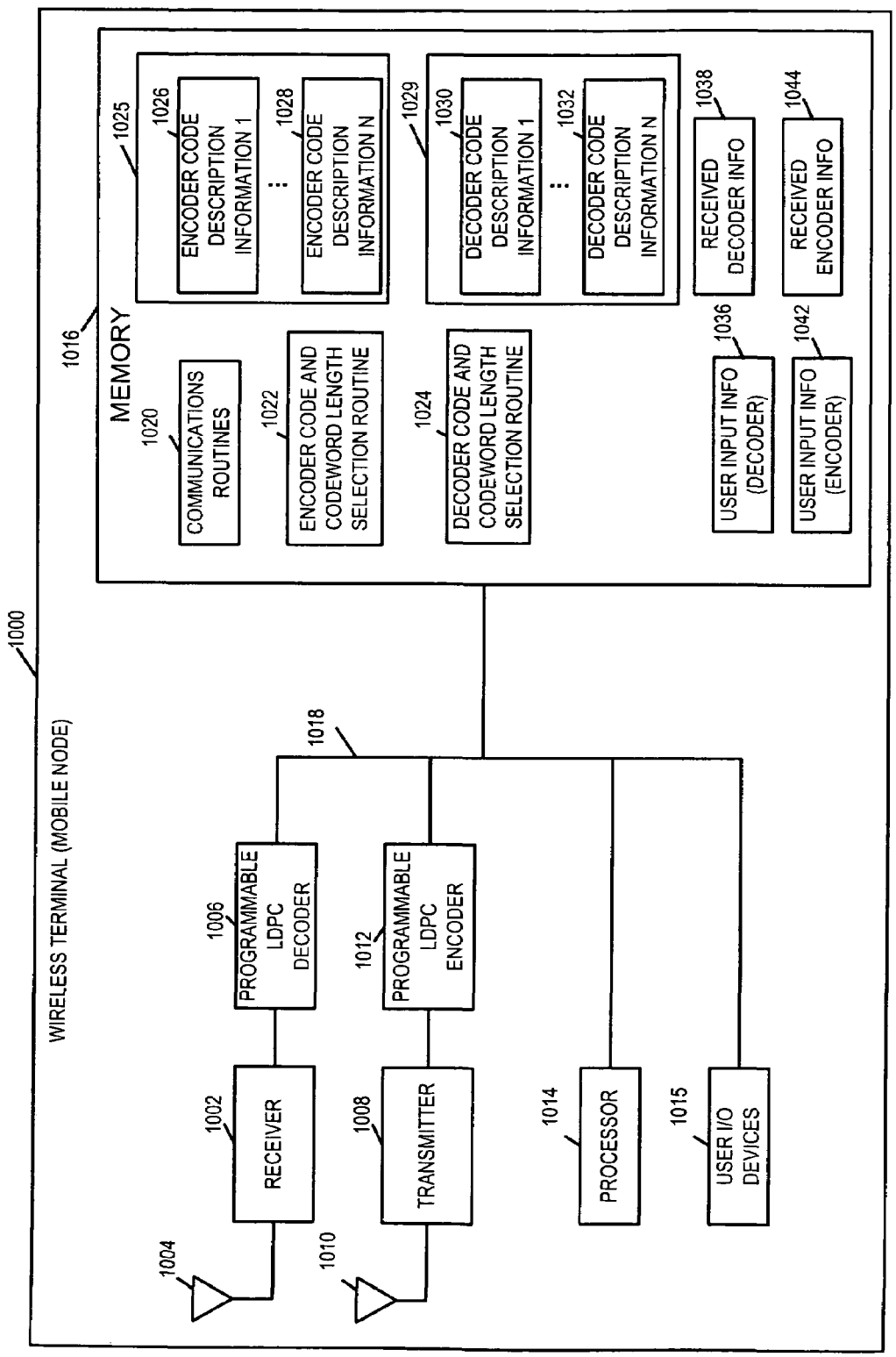
FIG. 6 illustrates a device, e.g., mobile node, which uses an exemplary programmable LDPC decoder implemented in accordance with the present invention.

FIG. 6 is a drawing of an exemplary wireless terminal (WT) 1000, e.g., mobile node, implemented in accordance with LDPC encoder/decoder apparatus that use methods of the present invention. Exemplary WT 1000 includes a receiver 1002, a receiver antenna 1004, a programmable LDPC decoder 1006, a transmitter 1008, a transmitter antenna 1010, a programmable LDPC encoder 1012, a processor 1014, user I/O devices 1015 and a memory 1016. The programmable LDPC decoder 1006 (which can be implemented using the decoder 900 of FIG. 5), programmable LDPC encoder 1012, processor 1014, user I/O devices 1015 and memory 1016 are coupled together via a bus 1018 over which the various elements may interchange data and information.

The receiver 1002 is coupled to the receiver antenna 1004 through which the WT 1000 may receive signals from other devices, e.g., encoded downlink signals from a base station. The receiver 1002 is also coupled to the programmable LDPC decoder 1006 which may decode received downlink signals in accordance with the invention. Received signals may include, e.g., in addition to LDPC coded data, signals, e.g., control information, used to indicate LDPC code structure used to encode data which is being received and/or the codeword length of codewords included in received data. The received data may include codewords corresponding to different applications. In accordance with the invention, the decoder may switch from decoding data corresponding to a first code structure and codeword length to decoding data corresponding to a second code structure and a second codeword length. The first and second codeword structures may be different with the decoder being loaded with the appropriate code structure information, e.g., control code in the form of microcode, in response to information included in the received information. The control information is normally not encoded using LDPC codes to facilitate rapid detection and interpretation of the control information. The first and second codeword lengths can also be different. In some cases, the first and second code structures are the same but the codeword lengths of data corresponding to different applications may be different. In such case the code structure information need not be updated to decode the codewords of different sizes and merely the codeword length information, e.g., lifting factor information need be supplied to the decoder as the codeword length of the received data changes. The codeword length information may be specified as a code lifting factor for the code structure being used. As will be discussed below, code structure information, e.g., control code, can be used to control the programmable LDPC decoder while codeword length information can be used to set the codeword length for decoding purposes. Such information can be conveyed to the decoder 1006 from memory 1016 via bus 1018.

The transmitter 1008 is coupled to the transmitter antenna 1010 through which the WT 1000 may transmit uplink signals including encoded uplink signals to base stations. The transmitter 1008 is coupled to the programmable LDPC encoder 1012 which encodes various uplink signals, e.g., data signals corresponding to different applications, prior to transmission. The encoder can be loaded with different sets of code description information, e.g., different sets of control codes such as microcode, corresponding to different code structures. In addition the encoder 1012 can be supplied with codeword length information, e.g., in the form of code lifting factor information, used to control the length of codewords generated by the encoder 1012. Information selecting the codeword structure and/or codeword length may be obtained from received information, e.g., the encoder may encode data generated by an application using the same codeword structure and codeword length as was used to decode received data intended for the particular application generating data. Thus, the encoder may be programmed to match the encoding structure and codeword length being used by another device with which the wireless terminal is interacting. Alternatively, a user of the device may specify use of a particular codeword structure and/or codeword length or such information may be specified by a communications routine or other program stored in the wireless terminal.

Code structure information and/or codeword length information, e.g. in the form of a set of control commands, can be conveyed from memory 1016 to the programmable LDPC decoder 1006 and to the programmable LDPC encoder 1012 over bus 1018. User I/O devices 1015, e.g., keypads, speakers, microphones, displays, etc. provide interfaces for the user to input data and information, e.g., data and information to be encoded and communicated to another WT and for the user to output and/or display received data/information, e.g., received data and information from a peer node which has been decoded. User I/O devices 1015 provide an interface allowing a user to select and/or specify the code associated with a set of data, code length indicator, and/or sets of code description information to be used by the programmable LDPC decoder 1006 and/or programmable LDPC encoder 1012.

The processor 1014, e.g., a CPU, executes the routines and uses the data/information in memory 1016 to control the operation of the wireless terminal 1000 and implement the methods of the present invention.

Memory 1016 includes a group 1025 of encoder code description information sets 1026, 1028 and a group 1029 of decoder code description information sets 1030, 1032. Each encoder code description information set 1026, 1028 includes control codes, e.g., microcode, which reflects the code structure of the code to be used for encoding data. Each set of information 1026, 1028 corresponds to a different code structure. The encoder code description information can be loaded into the encoder control module of the programmable LDPC encoder 1012 and used, e.g., as stored encoder description information, to control encoding of data. Similarly, each of the decoder code description information sets 1030, 1032 includes control codes, e.g., microcode, which reflects the code structure of the code to be used for decoding data. Each set of decoder code description information 1030, 1032 corresponds to a different code structure. The decoder code description information can be loaded into the control module of the programmable LDPC decoder 1006 and used, e.g., as stored decoder description information, to control decoding of data.

Memory 1016 includes communications routines 1020, encoder code and codeword length selection routine 1022, and decoder code and codeword length selection routine 1024. Communications routines 1020 may control general communications and interactions with other wireless devices. The communications routine being implemented for given application may specify the code structure and/or codeword length to be used for a particular communications application when encoding and/or decoding data using LDPC codes. Encoder code and codeword selection routine 1022 is responsible for selecting the code structure and thus corresponding encoder code description information 1026, 1028 to be used for a particular application. This selection may be made based on information received from a communications routine 1020, information received via receiver 1002 or from user input. The encoder code and codeword length selection routine 1022 is responsible for loading the programmable LDPC encoder 1012 with the selected code description information and for supplying information, e.g., a selected code lifting factor, to the programmable encoder 1012 if it has not already been configured to perform encoding in accordance with the selected code and codeword length. Decoder code and codeword selection routine 1024 is responsible for selecting the code structure and thus corresponding decoder code description information 1030, 1032 to be used for a particular application. This selection may be made based on information received from a communications routine 1020, information received via receiver 1002 or from user input. The decoder code and codeword length selection routine 1024 is responsible for loading the programmable LDPC decoder 1006 with the selected code description information, e.g., control code, and for supplying information, e.g., a selected code lifting factor, to the programmable decoder 1006 if it has not already been configured to perform decoding in accordance with the selected code and codeword length.

In addition to the above discussed routines and information relating to encoding and decoding, the memory 1016 may be used to stored received decoder information 1038, e.g., received information used by the decoder code and codeword length selection routine 1024 which indicates a code structure and codeword length to be used for decoding. In addition received encoder information 1044, e.g., received information used by the encoder code and codeword length selection routine 1022 which indicates a code structure and codeword length to be used for encoding may be stored in memory 1016. User input information 1036 relating to decoding and user input information relating to encoding 1042 can also be stored in memory 1016. Such information may be the same as or similar to decoder information 1038 and encoder information 1044 but is obtained from a user via a user I/O device 1015 rather than via receiver 1002.

Figures 7, 7A:
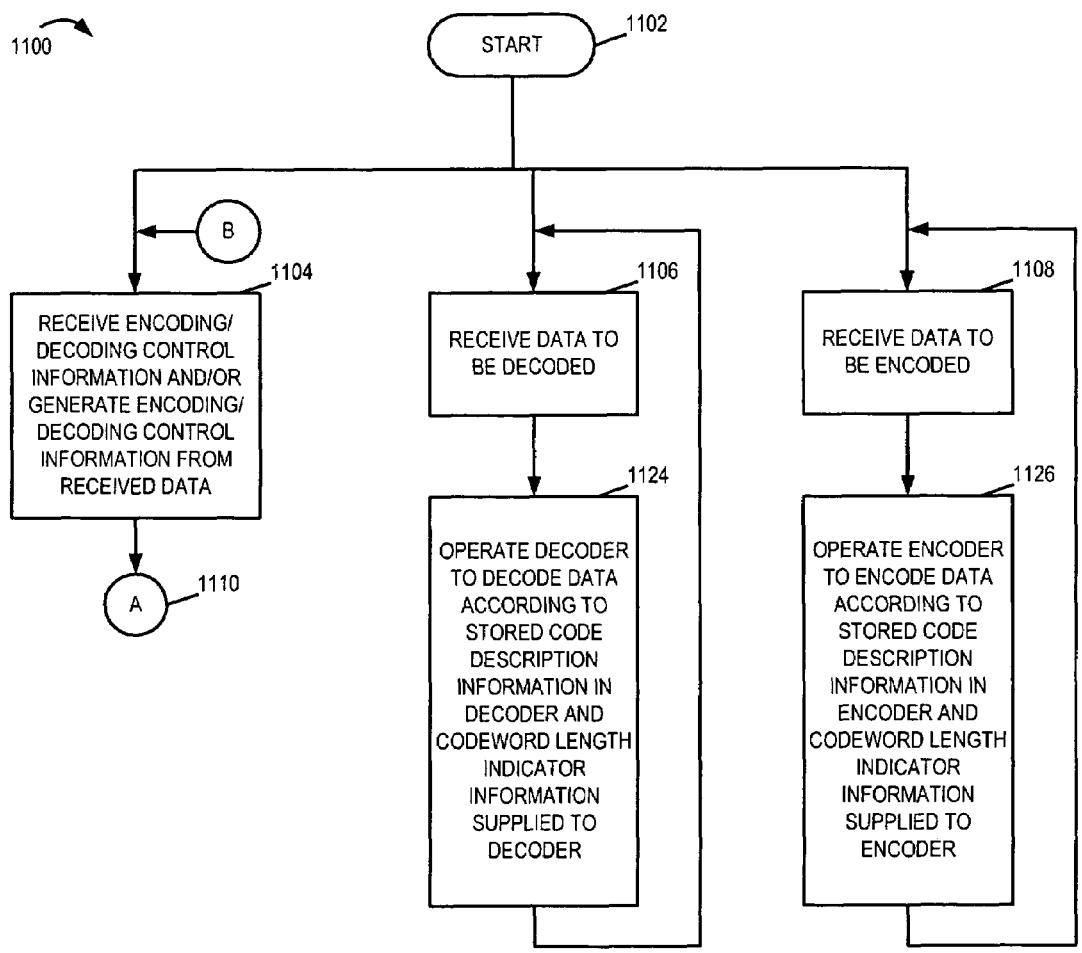
FIG. 7, comprising the combination of FIG. 7A and FIG. 7B, is a flowchart of an exemplary method of operating an exemplary communications device in accordance with the present invention to perform encoding and decoding in accordance with the present invention.
Figure 7B:
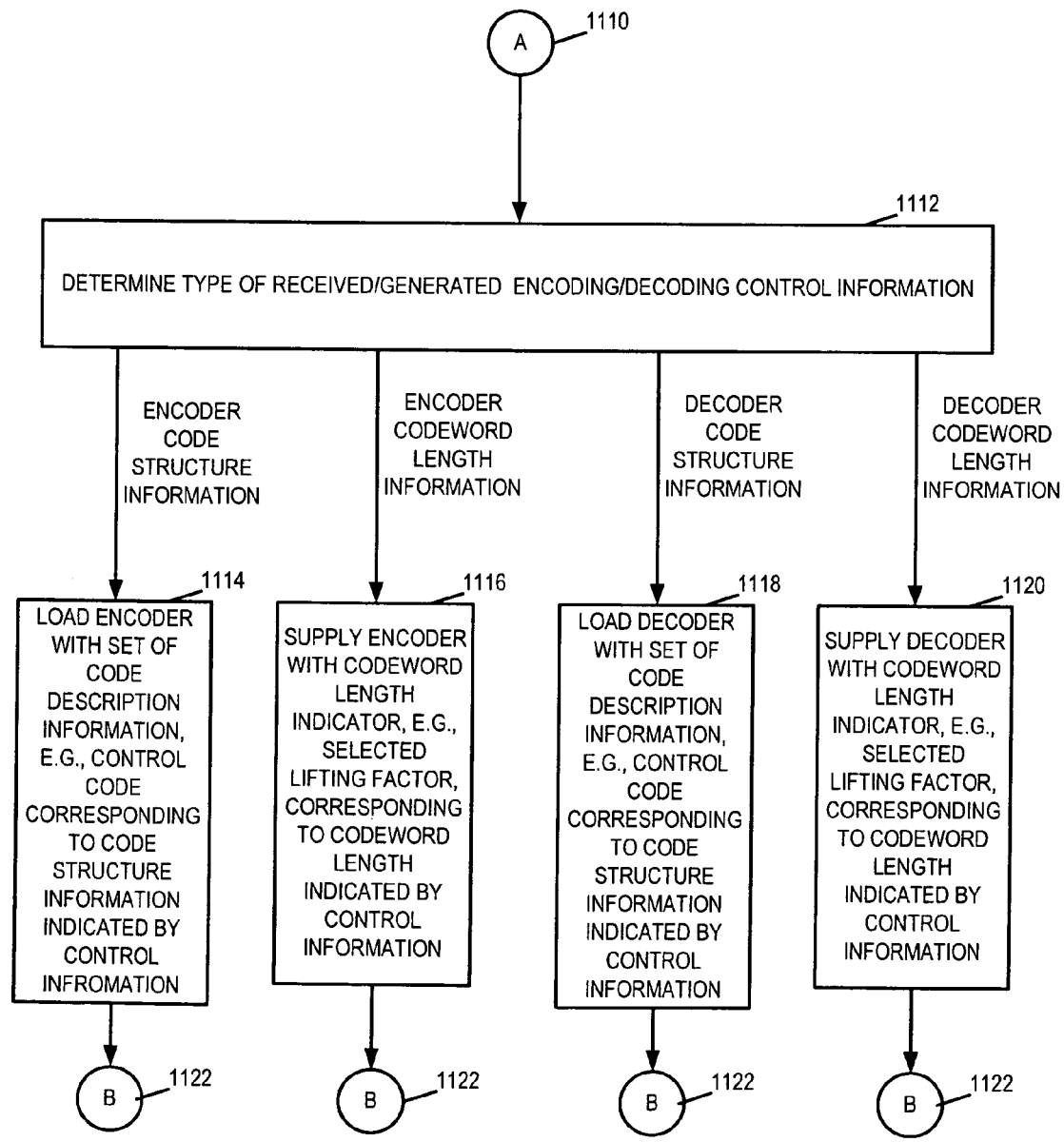

FIG. 7, comprising the combination of FIG. 7A and FIG. 7B, is a flowchart 1100 of an exemplary method of operating an exemplary communications device implemented in accordance with the present invention, e.g., WT 1000, to perform encoding and decoding in accordance with the present invention. Operation starts in step 1102, in which the WT 1000 is powered on and initialized. Operation proceeds from step 1102 to steps 1104, 1106, and steps 1108.

In step 1104, the WT 1000 is operated to receive encoding/decoding information and/or generate control information from received data. The encoding/decoding information, e.g., control information for the programmable LDPC encoder 1012 and/or programmable LDPC decoder 1006, may be received via a received signal processed through receiver 1002 and/or as user input received via user I/O devices 1015. In addition, received encoded data may be processed to generate control information. For example, multiple attempts at decoding can be performed using different code structure information and/or different codeword lengths. Upon successful decoding control information is generated in some embodiments indicating the code structure and/or codeword length which is to be used to decode incoming data and, in some embodiments encode outgoing data as well. Operation proceeds from step 1104 via connecting node A 1110 to step 1112. In step 1112, the WT 1000 is operated to determine the type of received encoding/decoding control information. Based upon the determination of step 1112, operation proceeds to step 1114, 1116, 1118, or 1120.

If it is determined in step 1112, that the type of control information is encoder code structure information, then operation proceeds to step 1114. In step 1114, the WT 1000 is operated to load the encoder 1012 with a set of code description information, e.g., control code corresponding to the code structure information indicated by the control information. Operation proceeds from step 1114 to connecting node B 1122.

If it is determined in step 1112, that the type of information is encoder codeword length information, then operation proceeds to step 1116. In step 1116, the WT 1000 is operated to supply the encoder 1012 with codeword length indicator, e.g., selected lifting factor, corresponding to the codeword length indicated by the control information. Operation proceeds from step 1116 to connecting node B 1122.

If it is determined in step 1112, that the type of control information is decoder code structure information, then operation proceeds to step 1118. In step 1118, the WT 1000 is operated to load the decoder 1006 with a set of code description information, e.g., control code corresponding to the code structure indicated by the control information. Operation proceeds from step 1118 to connecting node B 1122.

If it is determined in step 1112, that the type of information is decoder codeword length information, then operation proceeds to step 1120. In step 1120, the WT 1000 is operated to supply the decoder 1006 with codeword length indicator, e.g., selected lifting factor, corresponding to indicate codeword length. Operation proceeds from step 1120 to connecting node B 1122.

From connecting node B 1122 operation returns to step 1104, where WT 1104 waits to receive other encoding/decoding information, e.g., information to complete the configuration of the programmable decoder 1006 and/or programmable encoder 1012, and/or information to change selected settings, e.g., codeword length settings, of the decoder 1006 and/or encoder 1012.

In step 1106, the WT 1000 including a previously configured programmable decoder 1006 is operated to receive through receiver 1002 data to be decoded, e.g., encoded user data from a peer node of WT 1000. The received data is forwarded to the decoder 1006. Operation proceeds from step 1106 to step 1124. In step 1124, the decoder 1006 is operated to decode data according to stored code description information in decoder 1006 and codeword length indicator information that has been supplied to the decoder. Operation proceeds from step 1124 to step 1106, where additional data to be decoded is received.

In step 1108, the WT 1000 including a previously configured programmable encoder 1012 is operated to receive through user I/O devices 1015 data to be encoded, e.g., input data from the user of WT 1000 intended to be encoded and communicated to a peer node of WT 1000. The received data is forwarded to the encoder 1012. Operation proceeds from step 1108 to step 1126. In step 1126, the encoder 1012 is operated to encode data according to stored code description information and codeword length indicator information supplied to the encoder. Operation proceeds from step 1126 to step 1108, where additional data to be encoded is received.

Over time, as the control information corresponding to the codeword length information, e.g., selected lifting factor, loaded into the encoder 1012 and decoder 1006 changes, the codeword length will change. Thus, the codeword length can, and in various implementations will, change as the wireless terminal switches from receiving data corresponding to a first device and/or application to processing data corresponding to second device and/or application. In addition, the code structure information used by the encoder 1012 and/or decoder 1006 can be changed over time as the wireless terminal interacts with a different device and/or implements a different application. Thus, at a first point in time the encoder and decoder may process codewords corresponding to a first length and/or code structure and at another time processes codewords corresponding to a second length and/or code structure. At still other points in time the programmable LDPC encoders 1012 and decoders 1006 of the present invention may use other code structures and/or codeword lengths. The various supported codeword lengths will normally be up to a maximum size determined by the amount of memory available and/or number and size of available registers in the encoder 1012 and decoder 1006.

For a detailed discussion of an exemplary programmable LDPC encoder which can, and in some embodiments is used, as the programmable LDPC encoder 1012, see U.S. patent application Ser. No. 10/895,547, titled "LDPC ENCODING METHODS AND APPARATUS", filed on the same day as the present application, names as inventors Tom Richardson and Hui Jin, and which is hereby expressly incorporated by reference.

Using the above discussed routines and stored encoder/decoder information, the wireless terminal can, and does, switch between using different code structures and codeword lengths for both encoding and decoding purposes as a function of received information, e.g., user information or information received via receiver 1002. Encoder/decoder changes may also be triggered by the particular communications routine 1020 executed at a particular point in time. Accordingly, the present invention allows for a great deal of flexibility in encoding and decoding of LDPC codes with a single set of hardware which can be easily modified through the use of code updates corresponding to different code structures and/or changes in a codeword length control parameter.

The following patent applications and patent provide information on encoding and/or decoding LDPC codes and are hereby expressly incorporated by reference. U.S. patent application Ser. No. 10/788,115 filed Feb. 26, 2004; U.S. patent application Ser. No. 10/117,264 filed Apr. 4, 2002; U.S. patent application Ser. No. 10/618,325 and U.S. Pat. No. 6,633,856.

Numerous variations on the method and apparatus of the present invention are possible. For example, various features of the present invention may be implemented in hardware and/or software. The modules used to implement the present invention may be implemented as software, hardware, or as a combination of software and hardware. Some aspects of the invention may be implemented as processor executed program instructions. Alternatively, or in addition, some aspects of the present invention may be implemented as integrated circuits, such as ASICs for example. The apparatus of the present invention are directed to software, hardware and/or a combination of software and hardware. Machine readable medium including instructions used to control a machine to implement one or more method steps in accordance with the invention are contemplated and to be considered within the scope of some embodiments of the invention.

Thus, the present invention is directed to, among other things, software which can be used to control a processor to perform encoding and/or decoding in accordance with the present invention. The methods and apparatus of the present invention may be used with OFDM communications systems as well as with other types of communications systems including CDMA systems.

What is claimed is:

1. A method of operating an LDPC decoder to decode information previously encoded using a LDPC encoder, the method comprising:
   receiving a first codeword length information indicative of the length of first codewords to be decoded, said first codeword length information being a first code lifting factor used to indicate the number of times commands should be iteratively executed;
   receiving data including codewords to be decoded; and
   decoding the received data, said decoding including iteratively performing a set of commands, said decoding including controlling the number of times said set of commands is iteratively performed to decode a codeword in the received data as a function of the received codeword length information.

2. The method of claim 1, further comprising:
   receiving a second codeword length information indicative of the length of additional codewords to be decoded, said length of additional codewords being a second number of bits which is different form a first number of bits indicated by said first codeword length information.

3. The method of claim 1, further comprising:
   storing a first set of code structure description information in a module in said decoder; and
   using the stored first set of code description information to perform an LDPC decoding operation.

4. The method of claim 3, further comprising:
   storing a second set of code structure description information in said module in said decoder, the second set of code structure description information corresponding to a LDPC code having a different structure than a code structure to which the first set of code structure information corresponds.

5. The method of claim 4, further comprising:
   decoding data using the first set of code structure information when communicating with a first device; and
   decoding data using the second set of code structure information when communicating with a second device.

6. The method of claim 5, wherein the first set of code structure information is used at a different point in time from when the second set of code structure information is used.

7. The method of claim 3, wherein said step of storing a first set of code description information is in response to receiving a signal indicating that codewords corresponding to said first set of code description information are to be decoded.

8. The method of claim 3, wherein said step of storing a first set of code description information is in response to receiving a signal including codewords encoded according to a code structure corresponding to said first set of code description information.

9. The method of claim 3, wherein said first set of code description information includes decoder control instructions.

10. The method of claim 9, wherein each decoder control instruction includes one of a read and a write operation indicator.

11. The method of claim 10, where each decoder control instruction further includes rotation control information.

12. The method of claim 10, where each decoder control instruction further includes memory address information.

13. The method of claim 12, wherein each decoder control instruction further includes node configuration information indicating that a node processing unit should be configured as one of a variable node processing unit and a check node processing unit.

14. A programmable LDPC decoder for decoding information previously encoded using a LDPC encoder, comprising:
   means for storing a stored set of commands;
   means for receiving first codeword length information indicative of the length of first codewords to be decoded, said first codeword length information being a first code lifting factor used to indicate the number of times commands should be iteratively executed;
   means for receiving data including codewords to be decoded; and
   means for decoding the received data, said means for decoding including means for iteratively performing a set of commands and means for controlling the number of times said set of commands is iteratively performed to decode a codeword in the received data as a function of the received codeword length information.

15. The LDPC decoder of claim 14, further comprising: means for receiving decoder information used to control said decoding.

16. An LDPC decoder for decoding information previously encoded using a LDPC encoder, comprising:
   memory including a stored set of commands;
   a code word length information input for receiving first codeword length information indicative of the length of first codewords to be decoded, said first codeword length information being a first selected code lifting factor signal used to indicate the number of times commands should be iteratively executed;
   a data input for receiving data including codewords to be decoded; and
   processing circuitry for implementing said commands and thereby performing decoding operations on the received data including codewords in accordance with said set of commands; and
   a control module for controlling the number of times said processing circuitry iteratively performs said set of commands to decode a codeword in the received data as a function of the received codeword length information.

17. The LDPC decoder of claim 16, wherein said decoder is programmable, the decoder further comprising:
   stored decoder control information used to control said decoding.

18. A memory device embodying machine executable instructions for controlling a decoder circuitry to implement an LDPC decoding method, the method comprising:
   receiving first codeword length information indicative of the length of first codewords to be decoded, said first codeword length information being a first code lifting factor signal used to indicate the number of times commands should be iteratively executed;
   receiving data including codewords to be decoded; and
   decoding the received data, said decoding including iteratively performing a set of commands, said decoding including controlling the number of times said set of commands is iteratively performed to decode a codeword in the received data as a function of the received codeword length information.

19. The memory device of claim 18, embodying additional machine executable instructions for controlling the decoder circuitry to perform the steps of:
   storing a first set of code structure description information in a module in said decoder; and
   using the stored first set of code description information to perform an LDPC decoding operation.

20. An apparatus including a processor configured to control said apparatus to implement an LDPC decoding method, the method comprising:

receiving first codeword length information indicative of the length of first codewords to be decoded, said first codeword length information being a first code lifting factor used to indicate the number of times commands should be iteratively executed;

receiving data including codewords to be decoded; and decoding the received data, said decoding including iteratively performing a set of commands, said decoding including controlling the number of times said set of commands is iteratively performed to decode a codeword in the received data as a function of the received codeword length information.

21. The apparatus of claim 20, wherein the method further comprises:

storing a first set of code structure description information in a module in said decoder; and using the stored first set of code description information to perform an LDPC decoding operation.

* * * * *